(12) United States Patent
Badaroglu et al.

(10) Patent No.: US 12,513,915 B2
(45) Date of Patent: Dec. 30, 2025

(54) DYNAMIC RANDOM-ACCESS MEMORY (DRAM) ON HOT COMPUTE LOGIC FOR LAST-LEVEL-CACHE

(71) Applicant: QUALCOMM Incorporated, San Diego, CA (US)

(72) Inventors: Mustafa Badaroglu, San Diego, CA (US); Zhongze Wang, San Diego, CA (US); Woo Tag Kang, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 384 days.

(21) Appl. No.: 18/336,775

(22) Filed: Jun. 16, 2023

(65) Prior Publication Data

US 2024/0422995 A1    Dec. 19, 2024

(51) Int. Cl.
*H10B 80/00* (2023.01)
*H01L 25/00* (2006.01)
*H01L 25/065* (2023.01)
*H01L 25/18* (2023.01)

(52) U.S. Cl.
CPC ......... *H10B 80/00* (2023.02); *H01L 25/0657* (2013.01); *H01L 25/18* (2013.01); *H01L 25/50* (2013.01); *H01L 2225/06572* (2013.01); *H01L 2225/06586* (2013.01)

(58) Field of Classification Search
CPC ..... H10B 80/00; H01L 25/0657; H01L 25/18; H01L 25/50; H01L 2225/06572; H01L 2225/06586; H01L 2225/06513; H01L 2225/06517; H01L 2225/06524; G11C 11/005
See application file for complete search history.

(56) References Cited

U.S. PATENT DOCUMENTS

| | | | |
|---|---|---|---|
| 11,764,190 B1 * | 9/2023 | Manipatruni | H01L 23/525 257/777 |
| 2016/0364331 A1 | 12/2016 | Lee et al. | |
| 2022/0308995 A1 | 9/2022 | Gomes et al. | |
| 2023/0059491 A1 | 2/2023 | Dokania et al. | |
| 2023/0118453 A1 | 4/2023 | Liu et al. | |

OTHER PUBLICATIONS

International Search Report and Written Opinion—PCT/US2024/029258—ISA/EPO—Jul. 25, 2024.

* cited by examiner

*Primary Examiner* — Thanh Y. Tran
(74) *Attorney, Agent, or Firm* — Seyfarth Shaw LLP

(57) ABSTRACT

A stacked system-on-chip (SoC) is described. The stacked SoC includes a first memory die comprising a dynamic random-access memory (DRAM). The stacked SoC also includes a compute logic die. The compute logic die comprises a static random-access memory (SRAM) having a first SRAM partition and a second SRAM partition. The first memory die is stacked on the compute logic die. The compute logic die includes a memory controller. The memory controller is coupled between the first SRAM partition and the second SRAM partition. Additionally, the memory controller is coupled to a DRAM bus of the first memory die.

20 Claims, 14 Drawing Sheets

DYNAMIC RANDOM-ACCESS MEMORY (DRAM) ON HOT COMPUTE LOGIC FOR LAST-LEVEL-CACHE

BACKGROUND

Field

Aspects of the present disclosure relate to semiconductor devices and, more particularly, to a dynamic random-access memory (DRAM) on hot compute logic for last-level-cache (LLC) applications.

Background

Memory is a vital component for wireless communications devices. For example, a cell phone may integrate memory as part of an application processor, such as a system-on-chip (SoC) including a central processing unit (CPU) and a graphics processing unit (GPU). Successful operation of some wireless applications depend on the availability of high-capacity and low-latency memory solutions for scalability of CPU/GPU workload. In particular, a semiconductor memory device solution for providing a high-capacity, low-latency, and high-bandwidth memory for a last-level-cache is desired.

Semiconductor memory devices include, for example, a static random-access memory (SRAM) and a dynamic random-access memory (DRAM). A DRAM memory cell includes one transistor and one capacitor, thereby providing a high degree of integration. DRAM-on-logic, however, is hindered by temperature envelope limitations of DRAM on hotspots on the CPU/GPU of an SoC. An SRAM memory cell, by contrast, is bi-stable, meaning that it can maintain its state statically and indefinitely, so long as adequate power is supplied. SRAM also supports high speed operation, with lower power dissipation, which is useful for computer cache memory. SRAM area and scaling, however, are stalled by a currently available transistor roadmap. Accordingly, there is a need in the art for a DRAM and SRAM integration in an SoC.

SUMMARY

A stacked system-on-chip (SoC) is described. The stacked SoC comprises a first memory die comprising a dynamic random-access memory (DRAM). The stacked SoC also comprises a compute logic die. The compute logic die comprises a static random-access memory (SRAM) comprising a first SRAM partition and a second SRAM partition. The first memory die is stacked on the compute logic die. The compute logic die comprises a memory controller. The memory controller is coupled between the first SRAM partition and the second SRAM partition. Additionally, the memory controller is coupled to a DRAM bus of the first memory die.

A method of fabricating a stacked system-on-chip (SoC) is described. The method comprises forming a compute logic die, comprising a static random-access memory (SRAM) comprising a first SRAM partition and a second SRAM partition. The compute logic die also comprises a memory controller coupled between the first SRAM partition and the second SRAM partition. The method also comprises forming a first memory die comprising a dynamic random-access memory (DRAM). The method further comprises stacking the first memory die on the compute logic die. The method also comprises coupling the memory controller of the compute logic die to a DRAM bus of the first memory die.

This has outlined, broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for conducting the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
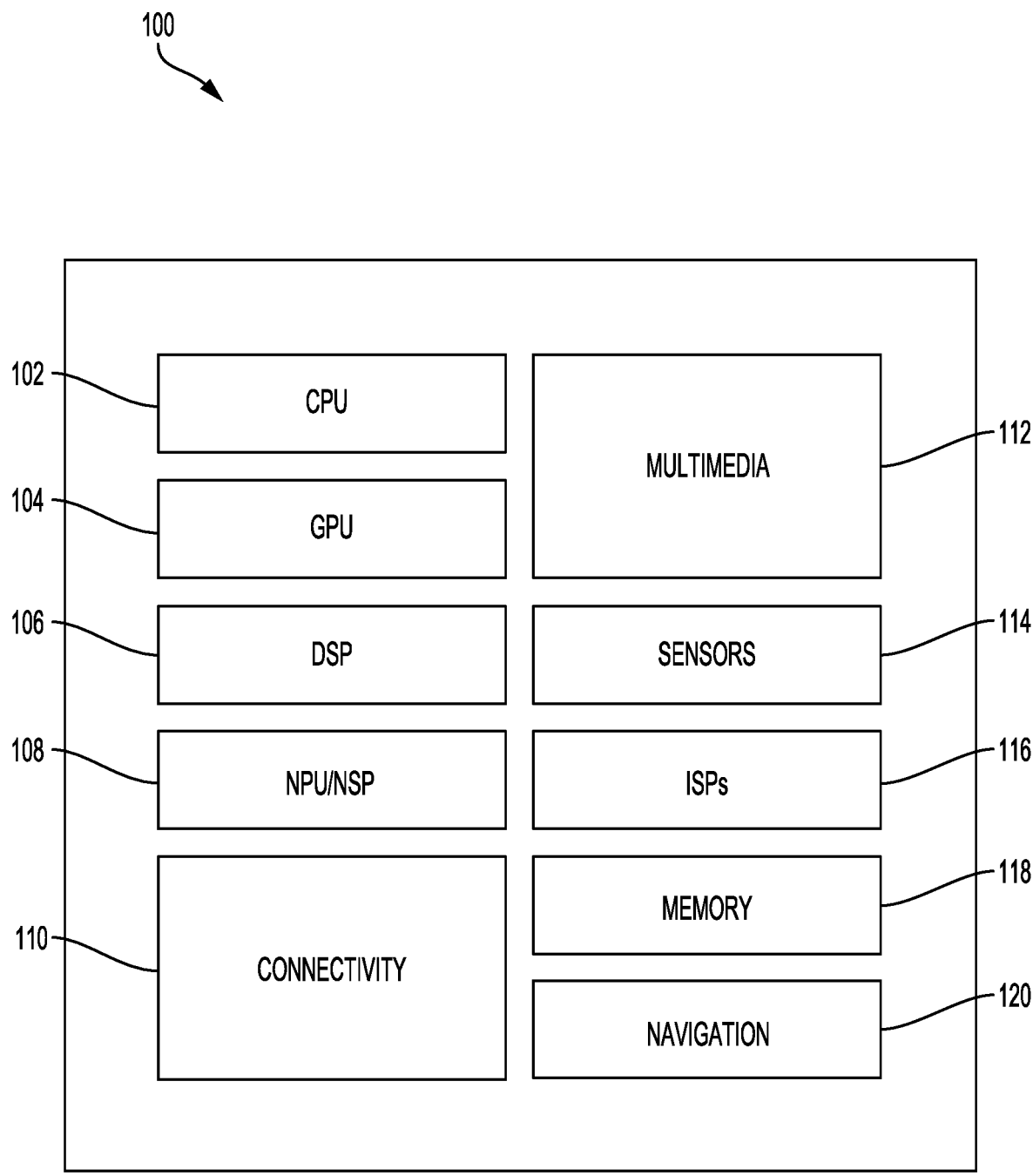
FIG. 1 illustrates an example implementation of a host system-on-chip (SoC), which includes an on-chip dynamic random access memory (DRAM) and static random-access memory (SRAM) integration, in accordance with various aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches, repeaters, and/or buffers. As described herein, the term "proximate" used throughout this description means "adjacent, very near, next to, or close to." As described herein, the term "on" used throughout this description means "directly on" in some configurations, and "indirectly on" in other configurations. It will be understood that the term "layer" includes film and is not construed as indicating a vertical or horizontal thickness unless otherwise stated. As described herein, the term "substrate" may refer to a substrate of a diced wafer or may refer to a substrate of a wafer that is not diced. Similarly, the terms "chip" and "die" may be used interchangeably.

Memory is a vital component for wireless communications devices. For example, a cell phone may integrate memory as part of an application processor, such as a system-on-chip (SoC) including a central processing unit (CPU), a graphics processing unit (GPU) and/or a neural signal processor (NSP). Successful operation of some wireless applications depends on the availability of high-capacity and low-latency memory solutions for scalability of CPU/GPU/NSP workload. In particular, a semiconductor memory device solution for providing a high-capacity, low latency, and high-bandwidth memory for a last-level-cache is desired.

Semiconductor memory devices include, for example, a static random-access memory (SRAM) and a dynamic random-access memory (DRAM). An SRAM memory cell is bi-stable, meaning that it can maintain its state statically and indefinitely, so long as adequate power is supplied. SRAM also supports high speed operation, with lower power dissipation, which is useful for computer cache memory. SRAM area and scaling, however, are stalled by a currently available transistor evolution roadmap particularly for six transistor (6T) SRAM implementations.

A DRAM memory cell includes one transistor and one capacitor, thereby providing a high degree of integration. DRAM-on-logic, however, is hindered by temperature envelope limitations of DRAM on hotspots on the CPU/GPU/NSP of an SoC. In particular, integrating DRAM to provide a last-level-cache (LLC) on hot compute logic including the CPU/GPU/NSP is problematic because this hot compute logic prevents cooling of the LLC-DRAM junction temperatures. Those limitations have led to industry implementation of LLC-DRAM in side-by-side configuration with the CPU/GPU/NSP of the hot compute logic.

Accordingly, various aspects of the present disclosure are directed to stacking a DRAM buffer over an SRAM portion of a logic core to provide an on-chip DRAM/SRAM integration. A stacked, system-on-chip (SoC) includes a memory die having a dynamic random-access memory (DRAM) on the memory die and a compute logic die. In various aspects of the present disclosure, the compute logic die includes a static random-access memory (SRAM), having a first SRAM partition and a second SRAM partition on the compute logic die. In some aspects of the present disclosure, the first memory die is stacked on the compute logic die. Additionally, the SoC includes a memory controller on the compute logic die. In various aspects of the present disclosure, the memory controller is coupled between the first SRAM partition and the second SRAM partition and coupled to a DRAM bus of the first memory die.

According to various aspects of the present disclosure, this SoC DRAM/SRAM integration enables placement of an LLC-DRAM on any hot CPU/GPU/NSP logic die. In various aspects of the present disclosure, a network-on-chip (NoC) controller is placed between SRAM partitions, which provides an LLC base that operates as a cold plate for supporting a memory die including DRAM. This placement of the NoC controller enables improved arbitration of data between the SoC cores, resulting in significantly improved latency. Furthermore, a reduced footprint of a DRAM cell (e.g., 0.00178 $\mu m^2$/cell) versus an SRAM cell (e.g., 0.026 $\mu m^2$/cell) provides a significantly larger density (e.g., 14.6×), resulting in improved latency, energy per bit (energy/bit) and cost when DRAM is stacked on SRAM. Additionally, the central placement of the NoC controller provides a coherent bus interface for LLC.

FIG. 1 illustrates an example implementation of a host system-on-chip (SoC) 100, which includes an on-chip dynamic random access memory (DRAM) and static random-access memory (SRAM) integration, in accordance with aspects of the present disclosure. The host SoC 100 includes processing blocks tailored to specific functions, such as a connectivity block 110. The connectivity block 110 may include sixth generation (6G), connectivity fifth generation (5G) new radio (NR) connectivity, fourth generation long term evolution (4G LTE) connectivity, Wi-Fi connectivity, USB connectivity, Bluetooth® connectivity, Secure Digital (SD) connectivity, and the like.

In this configuration, the host SoC 100 includes various processing units that support multi-threaded operation. For the configuration shown in FIG. 1, the host SoC 100 includes a multi-core central processing unit (CPU) 102, a graphics processor unit (GPU) 104, a digital signal processor (DSP) 106, and a neural processor unit (NPU)/neural signal processor (NSP) 108. The host SoC 100 may also include a sensor processor 114, image signal processors (ISPs) 116, a navigation module 120, which may include a global positioning system, and a memory 118. The multi-core CPU 102, the GPU 104, the DSP 106, the NPU/NSP 108, and the multimedia engine 112 support various functions such as video, audio, graphics, gaming, artificial networks, and the like. Each processor core of the multi-core CPU 102 may be a reduced instruction set computing (RISC) machine, an advanced RISC machine (ARM), a microprocessor, or some other type of processor. The NPU/NSP 108 may be based on an ARM instruction set.

Figure 2:
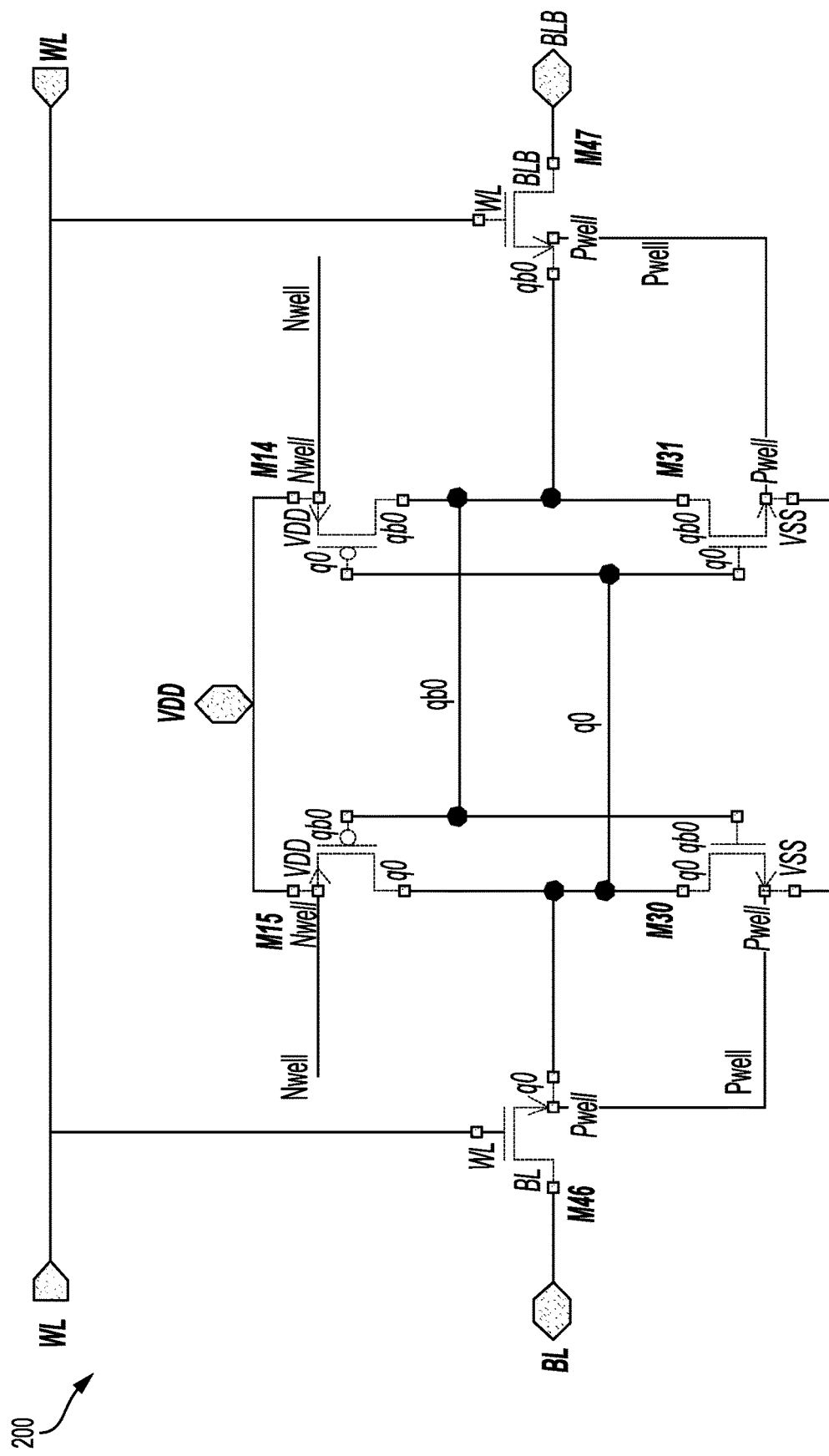
FIG. 2 is a circuit diagram illustrating a six transistor (6T) static random-access memory (SRAM) bitcell, according to various aspects of the present disclosure.

FIG. 2 is a circuit diagram illustrating a six transistor (6T) static random-access memory (SRAM) bitcell 200, according to various aspects of the present disclosure. As shown in FIG. 2, the bitline (BL) is coupled to an access transistor M46, and a bitline bar (BLB) is coupled to an access transistor M47, while a wordline (WL) is coupled to both access transistors M46, M47. Additionally, a cross-coupled inverter driving a q0 output node is formed by a serial combination of a P-type metal-oxide-semiconductor (PMOS) transistor M15 and an N-type metal-oxide-semiconductor (NMOS) transistor M30. Similarly, a cross-coupled inverter driving a qb0 output node is formed by a serial combination of a PMOS transistor M14 and an NMOS transistor M31. The sources of the transistors M15 and M14 are connected to the power supply node for the power supply voltage VDD. Similarly, the sources of the transistors M30 and M31 are connected to ground VSS. The q0 output node drives the gates of the transistors M14 and M31 whereas the qb0 output node drives the gates of the transistors M15 and M30.

The SRAM bitcell 200 is bi-stable, meaning that it can maintain its state statically and indefinitely, so long as adequate power is supplied. The SRAM bitcell 200 also supports high speed operation, with lower power dissipation, which is useful for computer cache memory. Area and scaling of the SRAM bitcell 200, however, are stalled by a currently available transistor evolution roadmap particularly for six transistor (6T) SRAM implementations. As shown in FIG. 2, the SRAM bitcell 200 exhibits a size density problem as a result of an enlarged footprint (e.g., 0.026 $\mu m^2$/cell) specified to support the access transistors M14, M15, M30, M31, M46, and M47.

Figure 3:
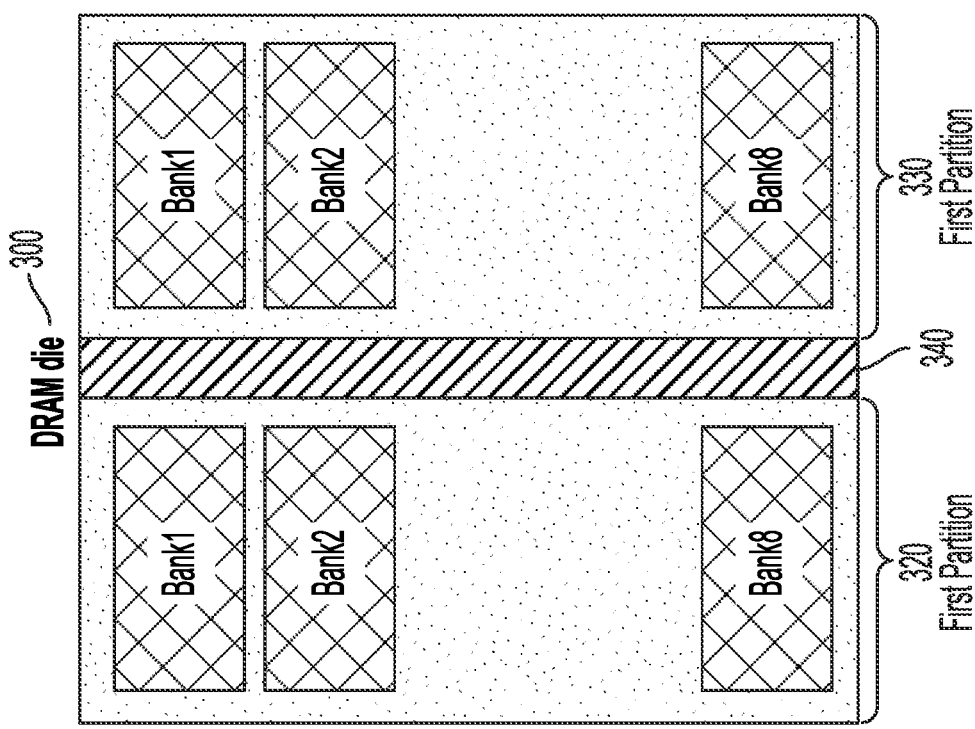
FIG. 3 is a schematic diagram illustrating a multi-bank dynamic random-access memory (DRAM) die, according to various aspects of the present disclosure.

FIG. 3 is a schematic diagram illustrating a multi-bank dynamic random-access memory (DRAM) die 300, according to various aspects of the present disclosure. As shown in FIG. 3, a DRAM die 300 includes a first memory partition 320 and a second memory partition 330 separated by a DRAM bus 340. In this example, the first memory partition 320 includes Bank1, Bank2, . . . , Bank8 to provide an eight-bank memory partition of DRAM memory cells. Similarly, the second memory partition 330 includes Bank1, Bank2, . . . , Bank8 to provide another eight-bank memory partition of DRAM memory cells.

A DRAM memory cell includes one transistor and one capacitor (1T1C), thereby providing a high degree of integration due to a reduced footprint (e.g., 0.00178 $\mu m^2$/cell). DRAM-on-logic, however, is hindered by temperature envelope limitations of DRAM on hotspots, such as the CPU 102, the GPU 104, and the NPU/NSP 108 of the system-on-chip (SoC) 100 of FIG. 1. In particular, integrating DRAM to provide a last-level-cache (LLC) on hot compute logic (e.g., the CPU 102, the GPU 104, and the NPU/NSP 108) of the SoC 100 is problematic because this hot compute logic prevents cooling of the LLC-DRAM junction temperatures. Accordingly, various aspects of the present disclosure are directed to stacking a DRAM buffer over an SRAM portion of a logic core to provide an on-chip DRAM/SRAM integration, for example, as shown in FIG. 4.

Figure 4:
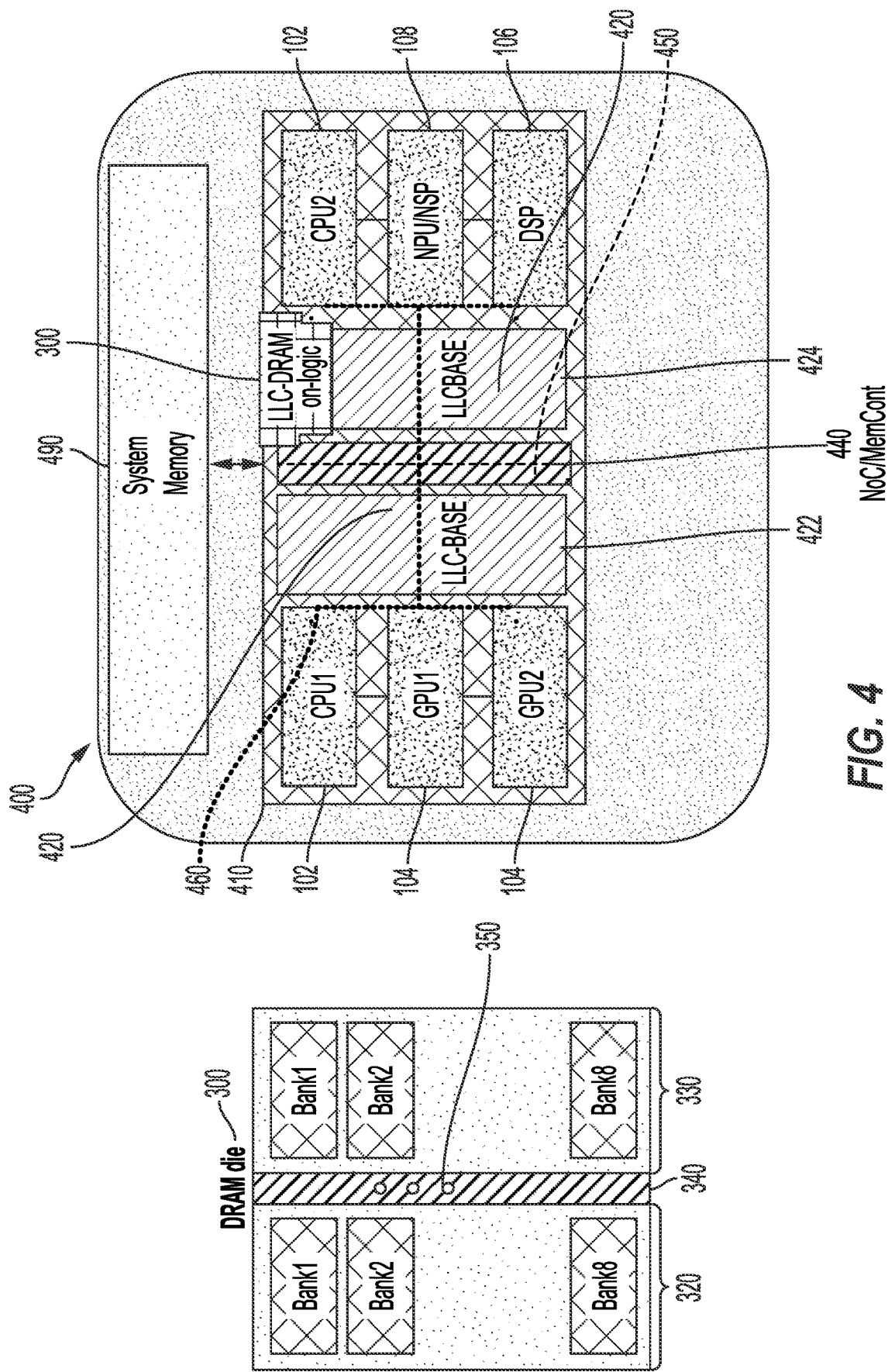
FIG. 4 is a schematic diagram illustrating a top-down view of a stacked system-on-chip (SoC) having an on-chip memory system integration, according to various aspects of the present disclosure.

FIG. 4 is a schematic diagram illustrating a top-down view of a stacked system-on-chip (SoC) 400 having an on-chip memory system integration, according to various aspects of the present disclosure. As shown in FIG. 4, the stacked SoC 400 includes the dynamic random-access memory (DRAM) die 300 of FIG. 3 and a compute logic die 410. In various aspects of the present disclosure, the compute logic die 410 includes a static random-access memory (SRAM) 420, having a first SRAM partition 422 and a second SRAM partition 424 on the compute logic die 410. In some aspects of the present disclosure, the first SRAM partition 422 includes a first quadrant and a second quadrant, and the second SRAM partition 424 includes a third quadrant and a fourth quadrant, although further quadrant splitting is possible to effect routing to the cores of the compute logic die 410, for example, placement of repeaters to enhance the signaling of the bus on the gap across quadrants. A system memory 490 is also coupled to the compute logic die 410. Additionally, the compute logic die 410 includes hot compute logic (e.g., the CPU 102, the GPU 104, the DSP 106, and the NPU/NSP 108) of the SoC 100 of FIG. 1, which may be communicably coupled to a memory controller 440 through a bus topology 460.

In some aspects of the present disclosure, the DRAM die 300 is stacked on the compute logic die 410. In this arrangement, the CPU 102, the GPU 104, the DSP 106, and the NPU/NSP 108 are placed at opposing peripheral portions of the compute logic die 410 and are separated by the SRAM 420, which effectively operates as a cold plate (e.g., an LLC-base) for helping cool junction temperatures of the DRAM die 300. Additionally, the stacked SoC 400 includes a memory controller 440 on the compute logic die 410. In various aspects of the present disclosure, the memory controller 440 is coupled between the first SRAM partition 422 and the second SRAM partition 424 and coupled to the DRAM bus 340 of the DRAM die 300 through first memory interconnects 350 as further illustrated, for example, in FIGS. 5-6B.

Figure 5:
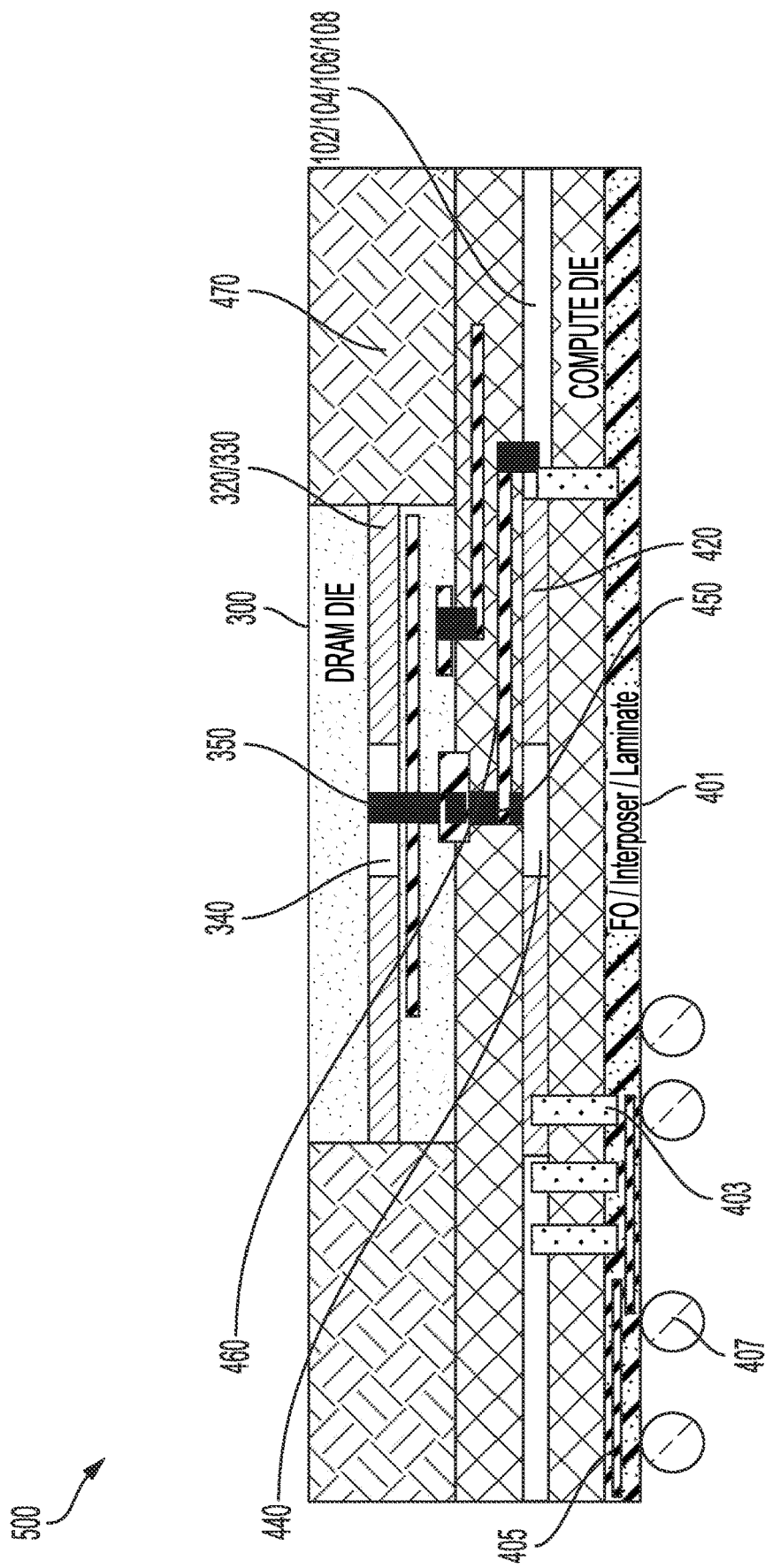
FIG. 5 is a schematic diagram illustrating a cross-sectional view of the stacked system-on-chip (SoC) of FIG. 4 having an on-chip memory system integration, according to various aspects of the present disclosure.

FIG. 5 is a schematic diagram illustrating a cross-sectional view of the stacked system-on-chip (SoC) 400 of FIG. 4 having an on-chip memory system integration, according to various aspects of the present disclosure. A cross-sectional view 500 of the stacked SoC 400 further illustrates the compute logic die 410 integrated with the dynamic random-access memory (DRAM) die 300, as shown in FIG. 3. This example further illustrates the first memory interconnects 350 (e.g., vertical connects through under bumps/pad-to-interconnect-vias) coupling the DRAM bus 340 through routing layers of the bus topology 460.

In various aspects of the present disclosure, the routing layers of the bus topology 460 are coupled to second memory interconnects 450 (e.g., vertical connects through under bumps/pad-to-interconnect-vias) of the memory controller 440. The first memory interconnects 350 and the second memory interconnects 450 may include hybrid bound or under bump bonding through the routing layers of the bus topology 460. In these aspects of the present disclosure, the memory controller 440 is configured as a network-on-chip (NoC) controller to route DRAM data and static random-access memory (SRAM) data through the routing layers of the bus topology 460. In this example, the memory controller 440 routes the DRAM data and the SRAM data through the routing layers of the bus topology 460 to the CPU 102, the GPU 104, the DSP 106, and the NPU/NSP 108, which are placed at opposing peripheral portions of the compute logic die 410. Further quadrant splitting of the first SRAM partition 422 and the second SRAM partition 424 may be performed for improved data routing in the compute logic die 410.

As shown in FIG. 5, a molding compound 470 surrounds portions of the DRAM die 300 to provide package support as well as thermal conduction. The molding compound 470 may include, but is not limited to, a mold material, a dielectric material, a glass material, a silicon-brick, an embedded molding compound (EMC), or other like package support/thermal conduction material. Additionally, the compute logic die 410 is supported by a substrate 401, which may be composed of a substrate, an interposer substrate, a fan-out (FO) substrate, or other like substrate. In this example, the SRAM 420 and the compute logic (e.g., the CPU 102, the GPU 104, the DSP 106, and the NPU/NSP 108) are coupled to through substrate vias (TSVs) 403. Additionally, redistribution layers (RDLs) 405 of the substrate 401 are coupled to the TSVs 403 to an under-bump metallization layer 407. In various aspects of the present disclosure, a backside surface of the DRAM die 300 is directly bonded to a front-side surface of the compute logic die 410.

Figure 6A:
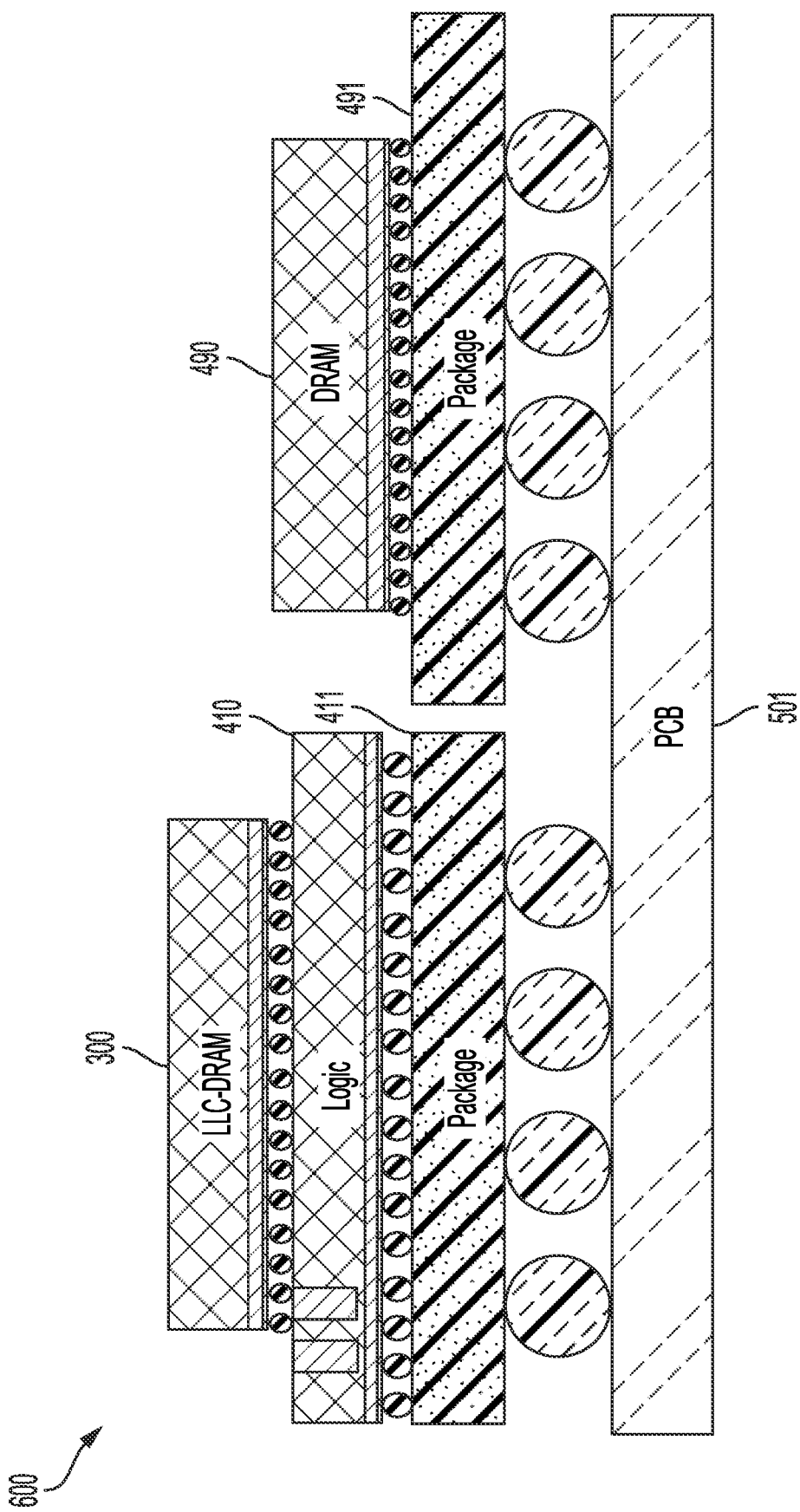
FIGS. 6A and 6B illustrate package implementations of the stacked system-on-chip (SoC) of FIG. 4, according to various aspects of the present disclosure.
Figure 6B:
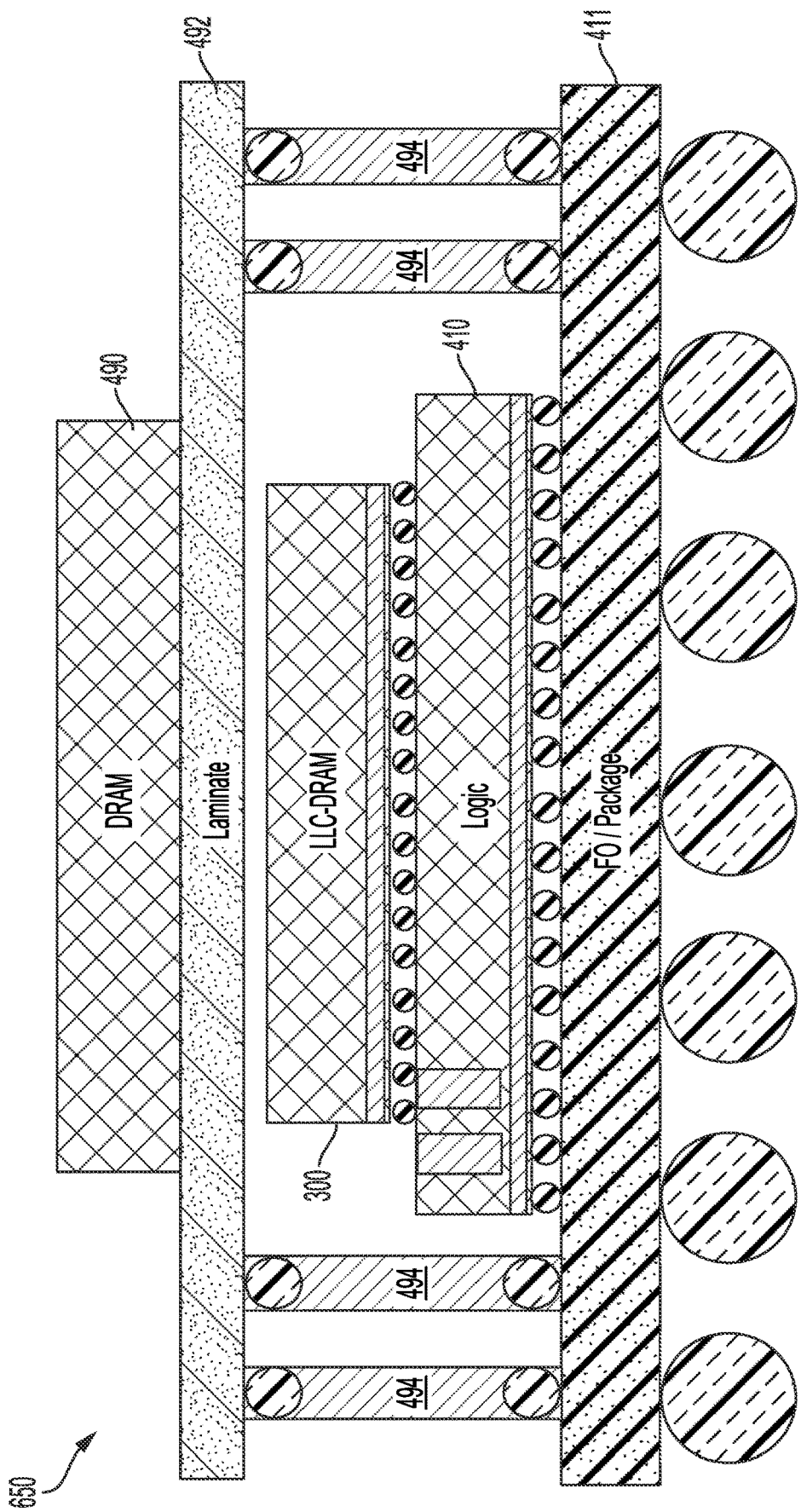

FIGS. 6A and 6B illustrate package implementations of the stacked system-on-chip (SoC) 400 of FIG. 4, according to various aspects of the present disclosure. As shown in FIG. 6A, a stacked SoC 600 includes the DRAM die 300 supported by the compute logic die 410 on a first package substrate 411. Additionally, the system memory 490 is supported by a second package substrate 491, with each of the first and second package substrates 411, 491 supported by a printed circuit board (PCB) 501. As shown in FIG. 6B, in a stacked SoC package-on-package (POP) configuration 650, the system memory 490 is supported by a laminate substrate 492 and coupled to the first package substrate 411 through conductive pillars 494. In this example, the first package substrate 411 may be configured as a fan-out (FO) package substrate.

Figure 7:
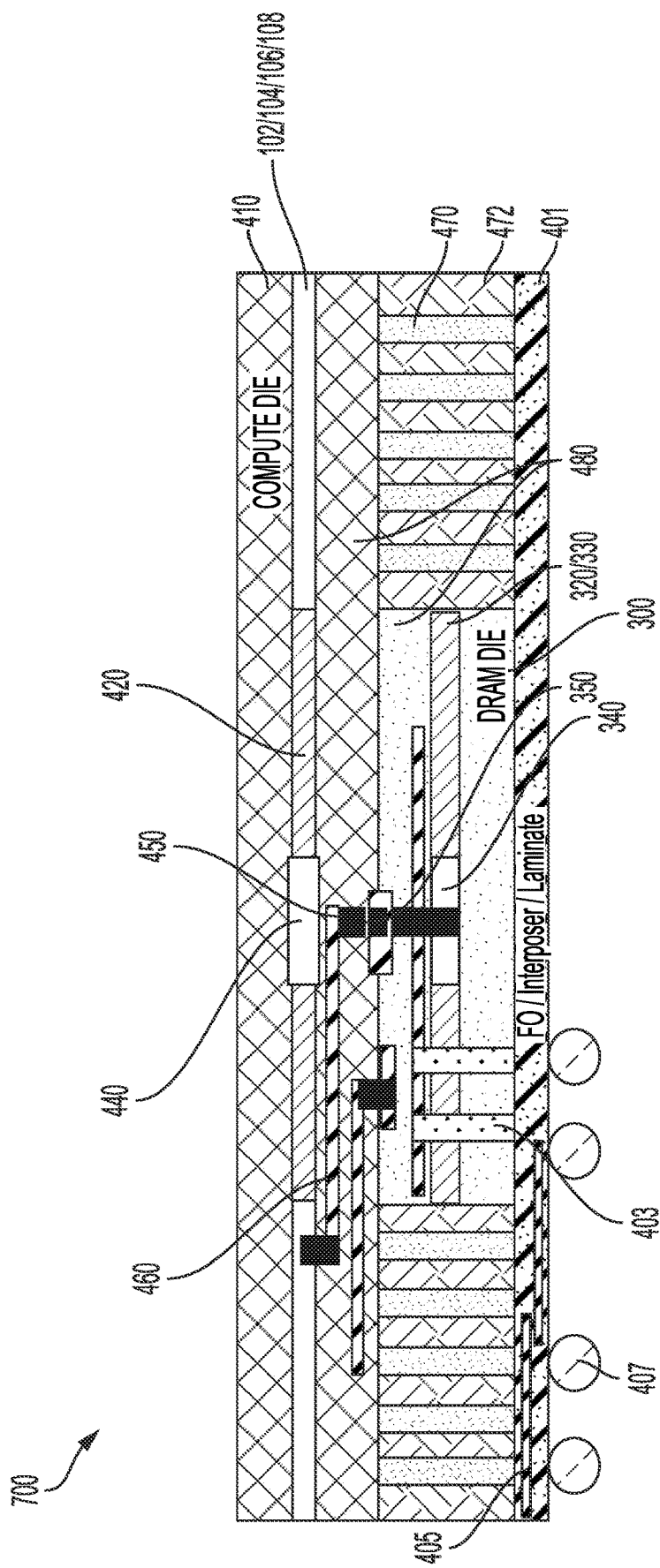
FIG. 7 is a schematic diagram illustrating a cross-sectional view of a stacked system-on-chip (SoC) having an on-chip memory system integration, according to various aspects of the present disclosure.

FIG. 7 is a schematic diagram illustrating a cross-sectional view of a stacked system-on-chip (SoC) 700 having an on-chip memory system integration, according to various aspects of the present disclosure. A cross-sectional view of the stacked SoC 700 further illustrates the compute logic die 410 of FIG. 4 integrated with the dynamic random-access memory (DRAM) die 300 of FIG. 3 according to an alternative configuration. The example of FIG. 7 further illustrates this alternative configuration, in which the DRAM die 300 supports the compute logic die 410 but is otherwise described using similar reference numbers. In this example, the first memory interconnects 350 coupling the DRAM bus 340 through the routing layers of the bus topology 460 are also shown. Additionally, the routing layers of the bus topology 460 are further coupled to the second memory interconnects 450 of the memory controller 440.

As shown in FIG. 7, the molding compound 470 surrounds portions of the DRAM die 300 to provide package support as well as thermal conduction, including through mold vias (TMVs) 472. Additionally, the DRAM die 300 is supported by the substrate 401. In this example, the first memory partition 320 and/or the second memory partition 330 are coupled to TSVs 403. Additionally, the redistribution layers (RDLs) 405 of the substrate 401 couple the TSVs 403 to the under-bump metallization layer 407. In this example, the compute logic die 410 and the DRAM die 300 are coupled through back-end-of-line (BEOL) layers 480.

Figure 8A:
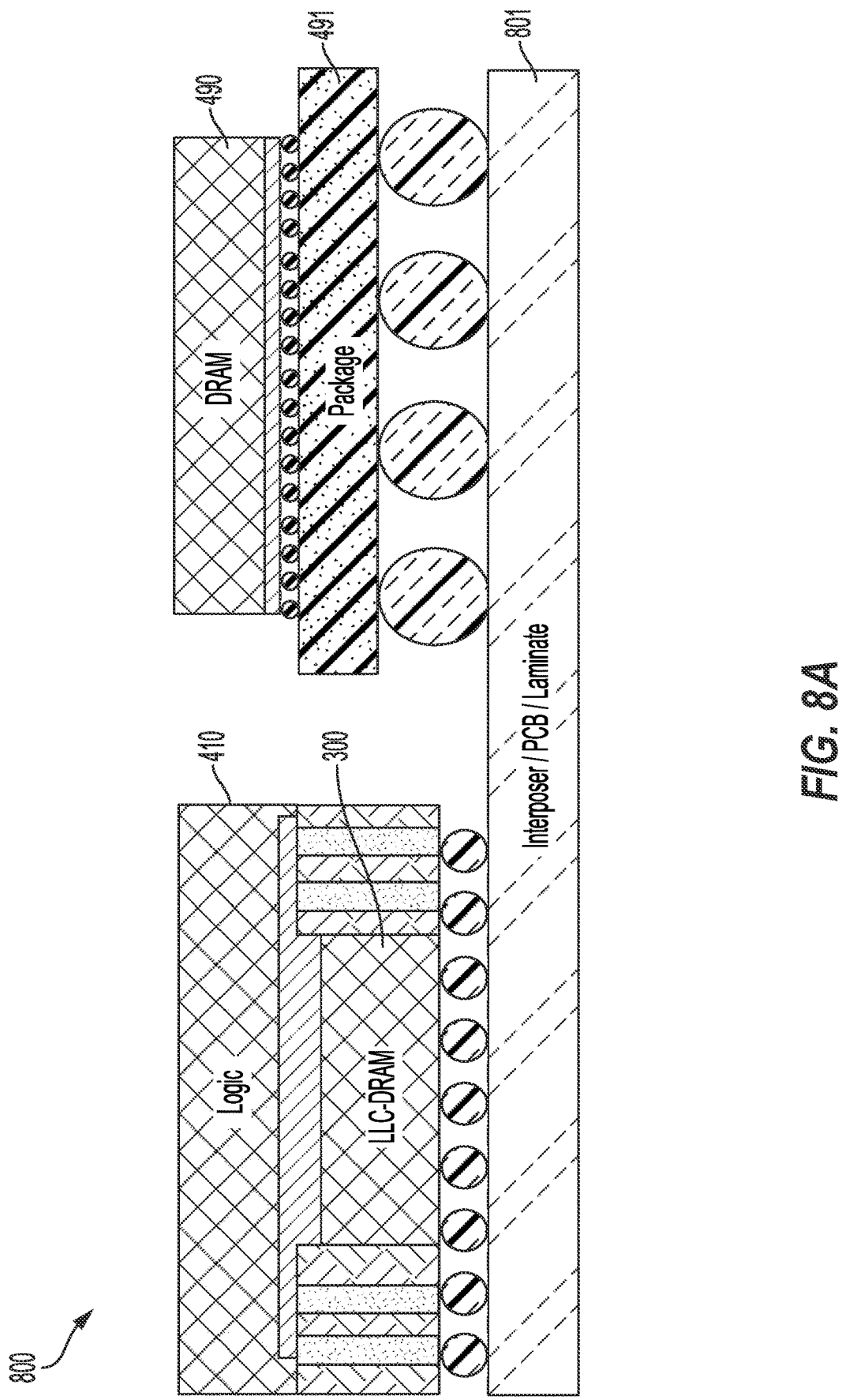
FIGS. 8A and 8B illustrate package implementations of the stacked system-on-chip (SoC) of FIG. 7, according to various aspects of the present disclosure.
Figure 8B:
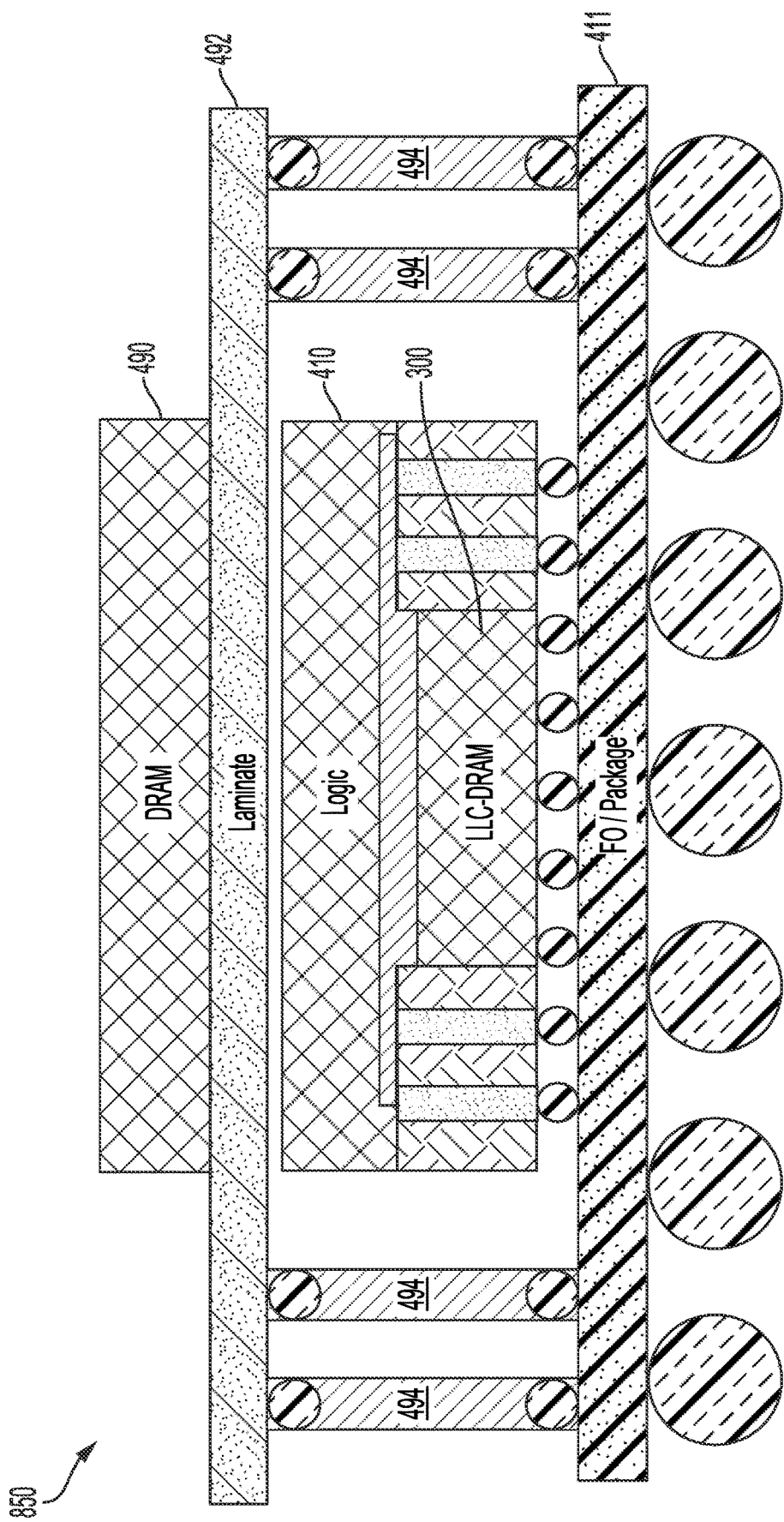

FIGS. 8A and 8B illustrate package implementations of the stacked system-on-chip (SoC) 700 of FIG. 7, according to various aspects of the present disclosure. As shown in FIG. 8A, a stacked SoC 800 includes the compute logic die 410 supported by the DRAM die 300. Additionally, the system memory 490 is supported by the second package substrate 491, with each of the DRAM die 300 and second package substrate 491 supported by a system board 801 (e.g., a printed circuit board (PCB), an interposer, or a laminate substrate). As shown in FIG. 8B, in a stacked SoC package-on-package (POP) configuration 850, the system memory 490 is supported by the laminate substrate 492 and coupled to the first package substrate 411 through the conductive pillars 494.

Figure 9:
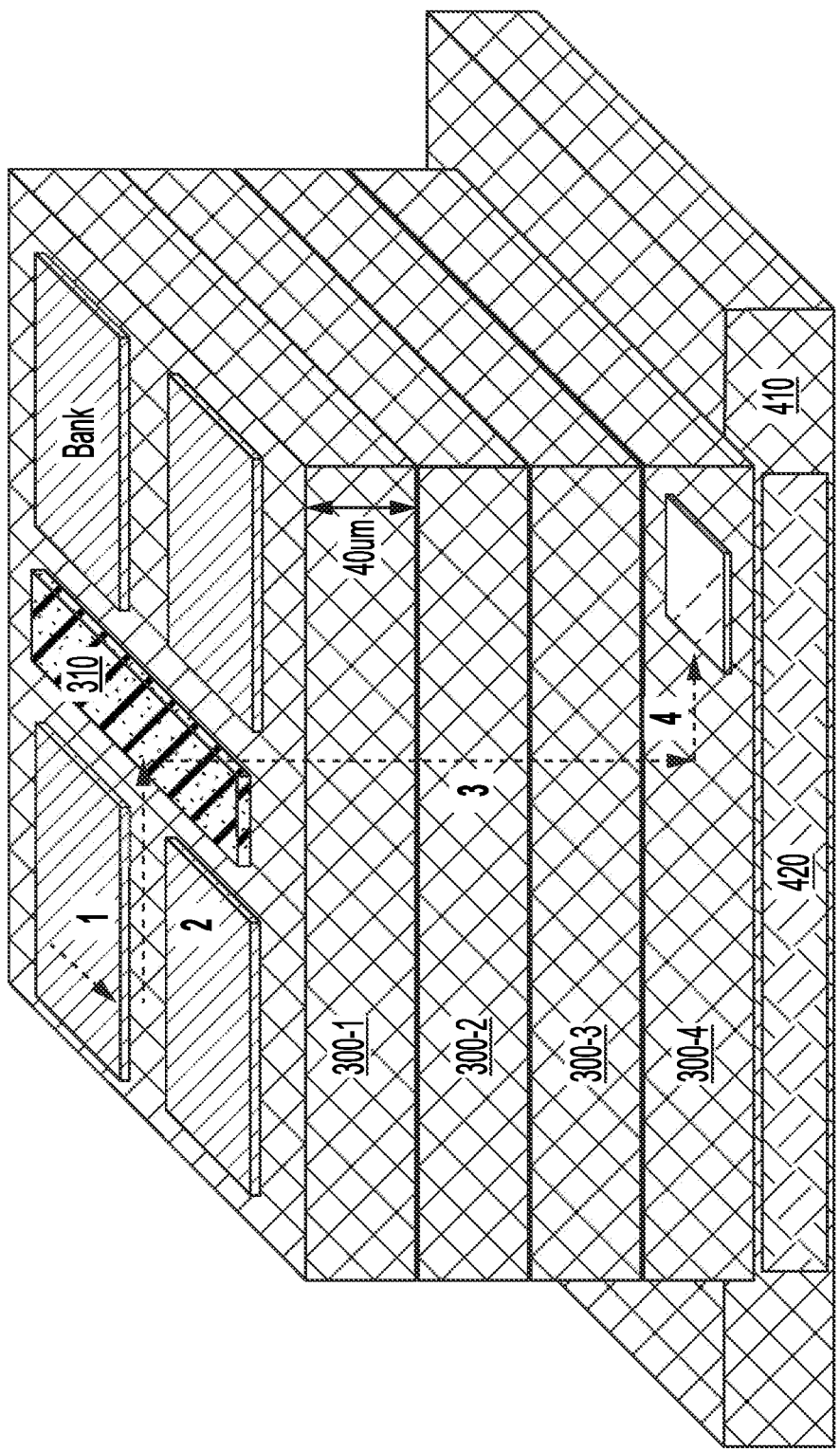
FIG. 9 is a block diagram illustrating a stacked system-on-chip (SoC), including a multiple memory integration, according to various aspects of the present disclosure.

FIG. 9 is a block diagram illustrating a stacked system-on-chip (SoC) 900, including a multiple memory integration, according to various aspects of the present disclosure. As shown in FIG. 9, the stacked SoC 900 includes the compute logic die 410 of FIG. 4 and is described using similar reference numbers. FIG. 9 illustrates a server configuration of the stacked SoC 900, in which the compute logic die 410 supports multiple ones of the dynamic random-access memory (DRAM) die 300 (e.g., a first memory die 300-1, a second memory die 300-2, a third memory die 300-3, a fourth memory die 300-4, etc.). A process of fabricating a stacked SoC is illustrated, for example, in FIG. 10.

Figure 10:
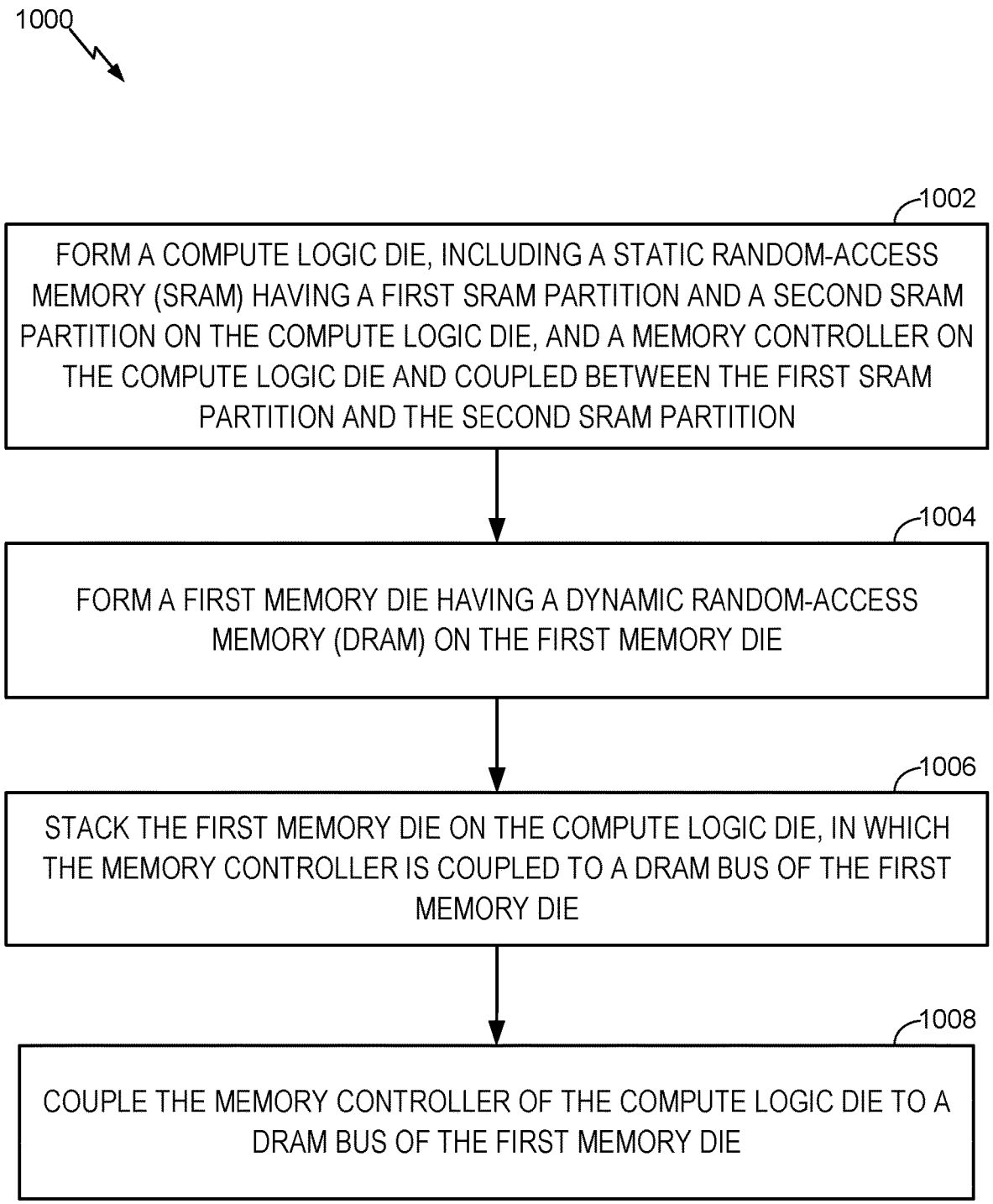
FIG. 10 is a process flow diagram illustrating a method for fabricating dynamic random-access memory (DRAM) and static random-access memory (SRAM) system-on-chip (SoC) integration, according to various aspects of the present disclosure.

FIG. 10 is a process flow diagram illustrating a method 1000 for fabricating a stacked system-on-chip (SoC), according to various aspects of the present disclosure. The method 1000 begins at block 1002, in which a compute logic die is formed, including a static random-access memory (SRAM) having a first SRAM partition and a second SRAM partition on the compute logic die, and a memory controller on the compute logic die and coupled between the first SRAM partition and the second SRAM partition. For example, as shown in FIG. 4, the compute logic die 410 includes a static random-access memory (SRAM) 420, having a first SRAM partition 422 and a second SRAM partition 424 on the compute logic die 410. Additionally, the stacked SoC 400 includes the memory controller 440 on the compute logic die 410 and coupled between the first SRAM partition 422 and the second SRAM partition 424.

At block 1004, a first memory die is formed, having a dynamic random-access memory (DRAM) on the first memory die. For example, as shown in FIG. 3, the DRAM die 300 includes the first memory partition 320 and a second memory partition 330 separated by a DRAM bus 340. In this example, the first memory partition 320 includes Bank1, Bank2, . . . , Bank8 to provide an eight-bank memory partition of DRAM memory cells. Similarly, the second memory partition 330 includes Bank1, Bank2, . . . , Bank8 to provide another eight-bank memory partition of DRAM memory cells.

At block 1006, the first memory die is stacked on the compute logic die. For example, as shown in FIG. 4, In some aspects of the present disclosure, the DRAM die 300 is stacked on the compute logic die 410. In this arrangement, the CPU 102, the GPU 104, the DSP 106, and the NPU/NSP 108 are placed at opposing peripheral portions of the compute logic die 410 and are separated by the SRAM 420, which effectively operates as a cold plate (e.g., an LLC-base) for helping cool junction temperatures of the DRAM die 300. The example of FIG. 7 illustrates an alternative configuration, in which the DRAM die 300 supports the compute logic die 410 but is otherwise described using similar reference numbers. In this example, the first memory interconnects 350 coupling the DRAM bus 340 through the routing layers of the bus topology 460 are also shown.

Additionally, the routing layers of the bus topology 460 are further coupled to the second memory interconnects 450 of the memory controller 440.

At block 1008, the memory controller of the compute logic die is coupled to a DRAM bus of the first memory die. For example, as shown in FIG. 4, the memory controller 440 is coupled between the first SRAM partition 422 and the second SRAM partition 424 and coupled to the DRAM bus 340 of the DRAM die 300 through first memory interconnects 350. FIG. 5 further illustrate the first memory interconnects 350 (e.g., vertical connects through under bumps/pad-to-interconnect-vias) coupling the DRAM bus 340 through routing layers of the bus topology 460. In various aspects of the present disclosure, the routing layers of the bus topology 460 are coupled to second memory interconnects 450 (e.g., vertical connects through under bumps/pad-to-interconnect-vias) of the memory controller 440.

Figure 11:
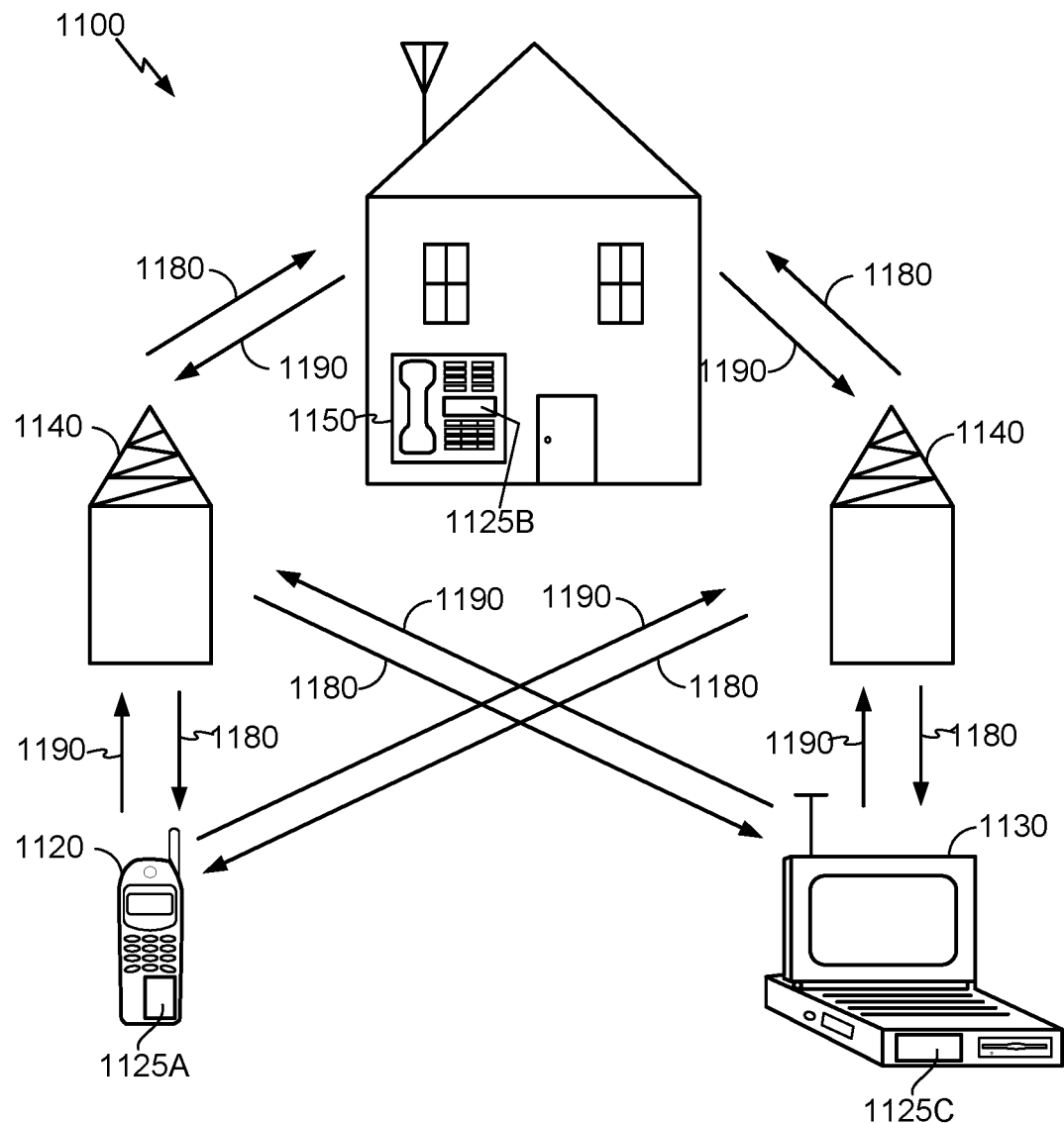
FIG. 11 is a block diagram showing an exemplary wireless communications system in which a configuration of the disclosure may be advantageously employed.

FIG. 11 is a block diagram showing an exemplary wireless communications system 1100 in which an aspect of the disclosure may be advantageously employed. For purposes of illustration, FIG. 11 shows three remote units 1120, 1130, and 1150, and two base stations 1140. It will be recognized that wireless communications systems may have many more remote units and base stations. Remote units 1120, 1130, and 1150 include IC devices 1125A, 1125C, and 1125B that include the disclosed DRAM/SRAM SoC integration. It will be recognized that other devices may also include the disclosed DRAM/SRAM SoC integration, such as the base stations, switching devices, and network equipment. FIG. 11 shows forward link signals 1180 from the base stations 1140 to the remote units 1120, 1130, and 1150, and reverse link signals 1190 from the remote units 1120, 1130, and 1150 to base stations 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be a mobile phone, a hand-held personal communications systems (PCS) unit, a portable data unit, such as a personal data assistant, a GPS enabled device, a navigation device, a set top box, a music player, a video player, an entertainment unit, a fixed location data unit, such as meter reading equipment, or other device that stores or retrieves data or computer instructions, or combinations thereof. Although FIG. 11 illustrates remote units according to aspects of the present disclosure, the disclosure is not limited to these exemplary illustrated units. Aspects of the present disclosure may be suitably employed in many devices, which include the disclosed DRAM/SRAM SoC integration.

Figure 12:
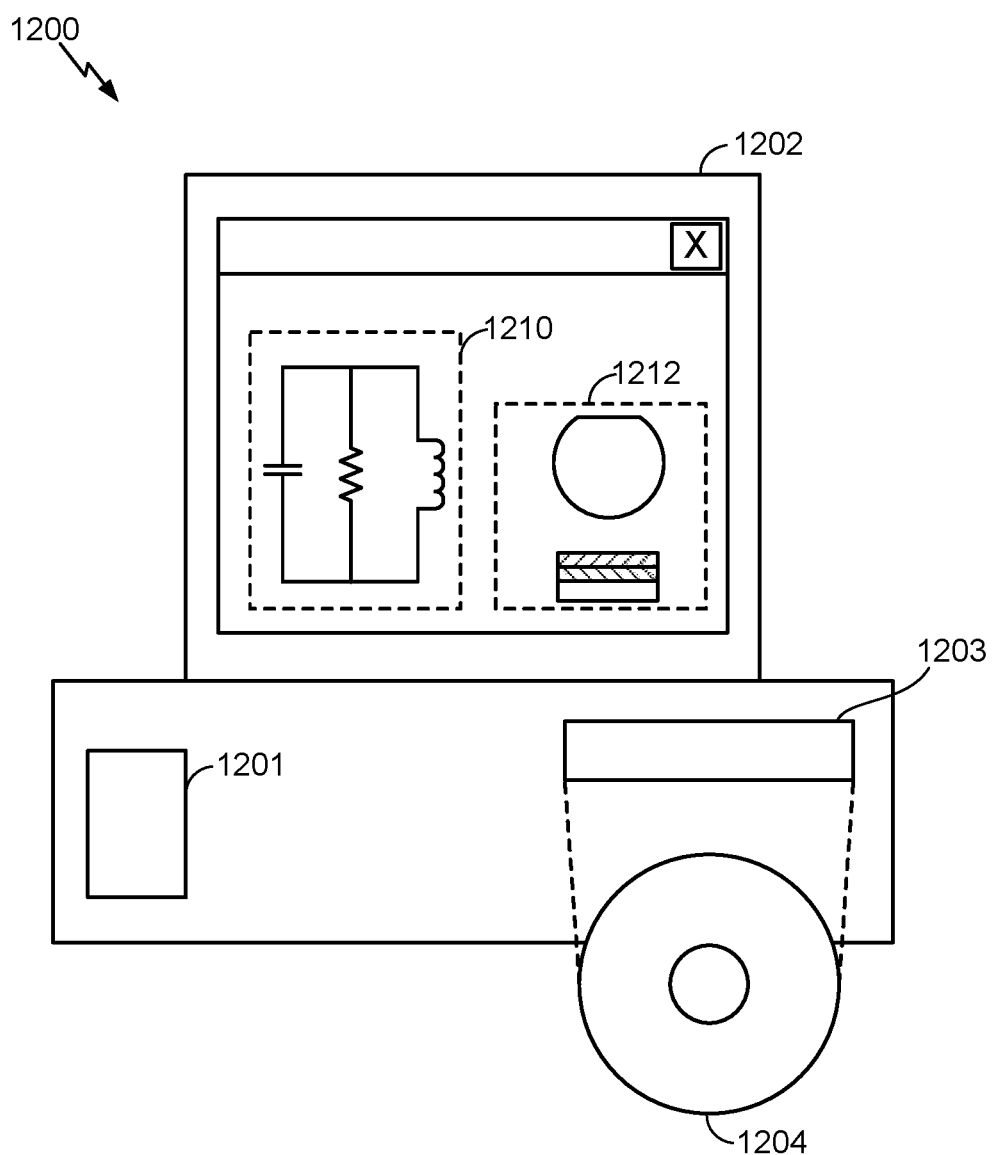
FIG. 12 is a block diagram illustrating a design workstation used for circuit, layout, and logic design of a semiconductor component according to one configuration.

FIG. 12 is a block diagram illustrating a design workstation used for circuit, layout, and logic design of a semiconductor component, such as the DRAM/SRAM SoC integration disclosed above. A design workstation 1200 includes a hard disk 1201 containing operating system software, support files, and design software such as Cadence or OrCAD. The design workstation 1200 also includes a display 1202 to facilitate design of a circuit 1210 or an integrated circuit (IC) component 1212 such as a fly bitline design. A storage medium 1204 is provided for tangibly storing the design of the circuit 1210 or the IC component 1212 (e.g., the DRAM/SRAM SoC integration). The design of the circuit 1210 or the IC component 1212 may be stored on the storage medium 1204 in a file format such as GDSII or GERBER. The storage medium 1204 may be a CD-ROM, DVD, hard disk, flash memory, or other appropriate device. Furthermore, the design workstation 1200 includes a drive apparatus 1203 for accepting input from or writing output to the storage medium 1204.

Data recorded on the storage medium 1204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1204 facilitates the design of the circuit 1210 or the IC component 1212 by decreasing the number of processes for designing semiconductor wafers.

Implementation examples are described in the following numbered clauses:

1. A stacked system-on-chip (SoC), comprising:
    a first memory die comprising a dynamic random-access memory (DRAM); and
    a compute logic die, comprising:
        a static random-access memory (SRAM) comprising a first SRAM partition and a second SRAM partition, in which the first memory die is stacked on the compute logic die; and
        a memory controller coupled between the first SRAM partition and the second SRAM partition, in which the memory controller is coupled to a DRAM bus of the first memory die.

2. The stacked SoC of clause 1, in which the first SRAM partition comprises a first quadrant and a second quadrant, and the second SRAM partition comprises a third quadrant and a fourth quadrant.

3. The stacked SoC of any of clauses 1 or 2, in which a backside surface of the first memory die is directly bonded to a front-side surface of the compute logic die.

4. The stacked SoC of any of clauses 1-3, in which the memory controller comprises a network-on-chip (NoC) controller.

5. The stacked SoC of any of clauses 1-4, further comprising a second memory die stacked on the first memory die.

6. The stacked SoC of any of clauses 1-5, further comprising a molding compound on the compute logic die and surrounding the first memory die.

7. The stacked SoC of any of clauses 1-6, further comprising a laminate substrate coupled to the compute logic die.

8. The stacked SoC of any of clauses 1-6, further comprising a laminate substrate coupled to the first memory die.

9. The stacked SoC of any of clauses 1-8, in which the first memory die comprises a last-level-cache (LLC)-DRAM.

10. The stacked SoC of any of clauses 1-9, further comprising a system memory coupled to the compute logic die.

11. A method of fabricating a stacked system-on-chip (SoC), the method comprising:
    forming a compute logic die, comprising a static random-access memory (SRAM) comprising a first SRAM partition and a second SRAM partition, and a memory controller coupled between the first SRAM partition and the second SRAM partition;
    forming a first memory die comprising a dynamic random-access memory (DRAM);
    stacking the first memory die on the compute logic die; and
    coupling the memory controller of the compute logic die to a DRAM bus of the first memory die.

12. The method of clause 11, in which the first SRAM partition comprises a first quadrant and a second quadrant, and the second SRAM partition comprises a third quadrant and a fourth quadrant.

13. The method of any of clauses 11 or 12, in which a backside surface of the first memory die is directly bonded to a front-side surface of the compute logic die.

14. The method of any of clauses 11-13, in which the memory controller comprises a network-on-chip (NoC) controller.

15. The method of any of clauses 11-14, further comprising stacking a second memory die on the first memory die.

16. The method of any of clauses 11-15, further comprising depositing a molding compound on the compute logic die and surrounding the first memory die.

17. The method of any of clauses 11-16, further comprising coupling a laminate substrate to the compute logic die.

18. The method of any of clauses 11-16, further comprising coupling a laminate substrate to the first memory die.

19. The method of any of clauses 11-18, in which the first memory die comprises a last-level-cache (LLC)-DRAM.

20. The method of any of clauses 11-19, further comprising coupling a system memory to the compute logic die.

For a firmware and/or software implementation, the methodologies may be implemented with modules (e.g., procedures, functions, etc.) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc, where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above, and below may refer to sides of a substrate or electronic device. Moreover, the scope of the present application is not intended to be limited to the configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform the same function or achieve the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the application and design constraints imposed on the overall system. Skilled artisans may implement the described functionality in varying ways for each application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A stacked system-on-chip (SoC), comprising:
a first memory die comprising a dynamic random-access memory (DRAM); and
a compute logic die, comprising:
  a static random-access memory (SRAM) comprising a first SRAM partition and a second SRAM partition, in which the first memory die is stacked on the compute logic die; and
  a memory controller coupled between the first SRAM partition and the second SRAM partition, in which the memory controller is coupled to a DRAM bus of the first memory die.

2. The stacked SoC of claim 1, in which the first SRAM partition comprises a first quadrant and a second quadrant, and the second SRAM partition comprises a third quadrant and a fourth quadrant.

3. The stacked SoC of claim 1, in which a backside surface of the first memory die is directly bonded to a front-side surface of the compute logic die.

4. The stacked SoC of claim 1, in which the memory controller comprises a network-on-chip (NoC) controller.

5. The stacked SoC of claim 1, further comprising a second memory die stacked on the first memory die.

6. The stacked SoC of claim 1, further comprising a molding compound on the compute logic die and surrounding the first memory die.

7. The stacked SoC of claim 1, further comprising a laminate substrate coupled to the compute logic die.

8. The stacked SoC of claim 1, further comprising a laminate substrate coupled to the first memory die.

9. The stacked SoC of claim 1, in which the first memory die comprises a last-level-cache (LLC)-DRAM.

10. The stacked SoC of claim 1, further comprising a system memory coupled to the compute logic die.

11. A method of fabricating a stacked system-on-chip (SoC), the method comprising:
forming a compute logic die, comprising a static random-access memory (SRAM) comprising a first SRAM partition and a second SRAM partition, and a memory controller coupled between the first SRAM partition and the second SRAM partition;
forming a first memory die comprising a dynamic random-access memory (DRAM);
stacking the first memory die on the compute logic die; and
coupling the memory controller of the compute logic die to a DRAM bus of the first memory die.

12. The method of claim 11, in which the first SRAM partition comprises a first quadrant and a second quadrant, and the second SRAM partition comprises a third quadrant and a fourth quadrant.

13. The method of claim 11, in which a backside surface of the first memory die is directly bonded to a front-side surface of the compute logic die.

14. The method of claim 11, in which the memory controller comprises a network-on-chip (NoC) controller.

15. The method of claim 11, further comprising stacking a second memory die on the first memory die.

16. The method of claim 11, further comprising depositing a molding compound on the compute logic die and surrounding the first memory die.

17. The method of claim 11, further comprising coupling a laminate substrate to the compute logic die.

18. The method of claim 11, further comprising coupling a laminate substrate to the first memory die.

19. The method of claim 11, in which the first memory die comprises a last-level-cache (LLC)-DRAM.

20. The method of claim 11, further comprising coupling a system memory to the compute logic die.

* * * * *